US012615950B2

(12) United States Patent
Du et al.

(10) Patent No.: US 12,615,950 B2
(45) Date of Patent: Apr. 28, 2026

(54) DISPLAY MODULE INCLUDING HEAT GENERATION ELEMENT BETWEEN HEAT DISSIPATION STRUCTURES

(71) Applicants: Chengdu BOE Optoelectronics Technology Co., Ltd., Sichuan (CN); BOE Technology Group Co., Ltd., Beijing (CN)

(72) Inventors: Yongqiang Du, Beijing (CN); Hui Zhao, Beijing (CN); Hengzhen Liang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 386 days.

(21) Appl. No.: 18/034,072

(22) PCT Filed: Jun. 29, 2022

(86) PCT No.: PCT/CN2022/102495
§ 371 (c)(1),
(2) Date: Apr. 27, 2023

(87) PCT Pub. No.: WO2024/000308
PCT Pub. Date: Jan. 4, 2024

(65) Prior Publication Data
US 2024/0324429 A1 Sep. 26, 2024

(51) Int. Cl.
*H10K 59/80* (2023.01)
*H10K 50/87* (2023.01)

(52) U.S. Cl.
CPC ....... *H10K 59/8794* (2023.02); *H10K 59/873* (2023.02); *H10K 50/87* (2023.02)

(58) Field of Classification Search
CPC .. H10K 50/87; H10K 59/8794; H10K 59/873; G09F 9/30
See application file for complete search history.

(56) References Cited

U.S. PATENT DOCUMENTS

2009/0021918 A1* 1/2009 Fang ................... H01L 23/4006
361/720
2010/0244005 A1 9/2010 Gyoda
(Continued)

FOREIGN PATENT DOCUMENTS

CN 202794766 U 3/2013
CN 105609536 A 5/2016
(Continued)

*Primary Examiner* — Ida M Soward
(74) *Attorney, Agent, or Firm* — Ling Wu; Stephen Yang; Ling and Yang Intellectual Property

(57) ABSTRACT

The present disclosure provides a display module and an intelligent terminal. The display module includes: a display panel; a first heat dissipation structure, wherein the first heat dissipation structure is disposed at a first side of the display panel, and the first heat dissipation structure is configured to dissipate heat for the display panel; a second heat dissipation structure, where the second heat dissipation structure is disposed at a side of the first heat dissipation structure away from the display panel, and a heat dissipation space is formed between the second heat dissipation structure and the first heat dissipation structure; a first heat generation element, wherein the first heat generation element includes at least one heat generation unit, and the at least one heat generation unit is located inside the heat dissipation space.

20 Claims, 11 Drawing Sheets

(56)                    References Cited

U.S. PATENT DOCUMENTS

| | | | |
|---|---|---|---|
| 2017/0059145 A1 | 3/2017 | Li et al. | |
| 2017/0118832 A1 | 4/2017 | Roh | |
| 2017/0237034 A1 | 8/2017 | Gao | |
| 2018/0027672 A1* | 1/2018 | Cho | H05K 5/0234 |
| | | | 361/697 |
| 2018/0156968 A1* | 6/2018 | Yoo | G02B 6/009 |
| 2018/0286924 A1* | 10/2018 | Lee | G06F 3/0412 |
| 2020/0116920 A1* | 4/2020 | Park | G02B 6/0085 |
| 2020/0196492 A1* | 6/2020 | Kim | G02F 1/133308 |
| 2020/0208824 A1* | 7/2020 | Wada | F21V 29/70 |
| 2021/0105909 A1* | 4/2021 | Ide | H04N 23/667 |
| 2022/0078949 A1* | 3/2022 | Li | G06F 1/1626 |
| 2022/0166082 A1 | 5/2022 | Wang et al. | |

FOREIGN PATENT DOCUMENTS

| | | | | |
|---|---|---|---|---|
| CN | 106612598 A | 5/2017 | | |
| CN | 108388046 A | 8/2018 | | |
| CN | 209803497 U | 12/2019 | | |
| CN | 111343833 A | 6/2020 | | |
| CN | 111564677 A * | 8/2020 | | H10K 59/8794 |
| CN | 211607154 U | 9/2020 | | |
| CN | 111968531 A | 11/2020 | | |
| CN | 212161797 U | 12/2020 | | |
| CN | 114333597 A | 4/2022 | | |
| FR | 3045912 B1 * | 8/2020 | | G09F 9/30 |
| TW | I587734 B | 6/2017 | | |

* cited by examiner

73

(a)          (b)          (c)

DISPLAY MODULE INCLUDING HEAT GENERATION ELEMENT BETWEEN HEAT DISSIPATION STRUCTURES

CROSS-REFERENCE TO RELATED APPLICATION

The present application is a U.S. National Phase Entry of International Application PCT/CN2022/102495 having an international filing date of Jun. 29, 2022, and entitled "Display Module, Intelligent Terminal". The entire contents of the above-identified application are hereby incorporated by reference.

TECHNICAL FIELD

The present disclosure relates to, but is not limited to, the field of display technology, and more particularly, to a display module and an intelligent terminal.

BACKGROUND

Vehicles can be not only means of transportation, but also a space for enjoying personal time. Various display devices can be installed on or in vehicles. With a display device, a user can, for example, receive real-time traffic information, send and receive e-mails, obtain information via the Internet, use remote diagnostic services for passengers in the vehicle or the vehicle itself, listen to music, play online games, and watch television programs (TV) and movies.

Since a display module in the vehicle requires high brightness, which is convenient for users to watch and operate, the display module will generate a large amount of heat, which will be transmitted to a display panel, so that the heat will accumulate in the display panel, resulting in local yellowing of the display module due to high heat, and long-term use will shorten service lives of light emitting materials of the display panel and cause moire on the display panel.

SUMMARY

The following is a summary of subject matter described herein in detail. The summary is not intended to limit the protection scope of claims.

In a first aspect, an embodiment of the present disclosure provides a display module, including:

a display panel;

a first heat dissipation structure, wherein the first heat dissipation structure is disposed at a first side of the display panel and configured to dissipate heat for display panel;

a second heat dissipation structure, wherein the second heat dissipation structure is disposed at a side of the first heat dissipation structure away from the display panel, and a heat dissipation space is provided between the second heat dissipation structure and the first heat dissipation structure; and a first heat generation element, wherein the first heat generation element includes at least one heat generation unit, and the at least one heat generation unit is located inside the heat dissipation space.

In an exemplary implementation, at least part of the display panel is in surface contact with the first heat dissipation structure, and the first heat dissipation structure is configured to dissipate heat generated by the display panel.

In an exemplary implementation, a surface of the first heat dissipation structure away from the display panel includes a first heat conduction area, and the first heat conduction area includes multiple first recesses.

In an exemplary implementation, an orthographic projection of at least part of the display panel on the first heat dissipation structure has an overlapped area with the first heat conduction area.

In an exemplary implementation, each first recess has a through hole structure or a groove structure.

In an exemplary implementation, the multiple first recesses in the first heat conduction area have a nonuniform distribution density.

In an exemplary implementation, the display panel includes a display area and a bonding area located on at least one side of the display area, and the distribution density of the multiple first recesses in the first heat conduction area gradually decreases from a direction close to the bonding area of the display panel to a direction away from the bonding area of the display panel.

In an exemplary embodiment, a distribution density of the multiple first recesses on a side close to the first heat generation element is greater than a distribution density of the multiple first recesses on a side away from the first heat generation element.

In an exemplary embodiment, a second heat generation element is further included, the second heat generation element is located inside the heat dissipation space, and a distribution density of the multiple first recesses on a side close to the second heat generation element is greater than a distribution density of the multiple first recesses on a side away from the second heat generation element.

In an exemplary implementation, the first heat conduction area further includes at least one first protrusion located between adjacent first recesses.

In an exemplary implementation, the first recess may be at least one of a column, a cone, a boss, and a strip.

In an exemplary implementation, the multiple first recesses are arranged in multiple rows of recesses extending in a first direction, each row of recesses includes at least two first recesses, the multiple rows of recesses are arranged in a second direction, and at least a portion of the first recesses in adjacent rows of recesses are aligned, and the first direction is different from the second direction.

In an exemplary implementation, a material of the first heat dissipation structure includes one or a combination of a metal, an alloy, a carbon base, and a polymer having thermal conductivity.

In an exemplary implementation, a first heat conduction adhesive layer is further included, the first heat conduction adhesive layer is located between the first heat dissipation structure and the display panel.

In an exemplary implementation, the first heat dissipation structure includes a first heat conduction layer and a blackening layer located on a surface of the first heat conduction layer.

In an exemplary implementation, the first heat generation element includes a plate body and at least one component disposed on a surface of the plate body close to the display panel, at least a portion of a surface of the plate body away from the display panel is in surface contact with the second heat dissipation structure, and the second heat dissipation structure is configured to dissipate the heat generated by the first heat generation element.

In an exemplary implementation, a second heat conduction adhesive layer is further included, the second heat conduction adhesive layer is located between the first heat generation element and the second heat dissipation structure.

In an exemplary embodiment, the first heat generation element further includes at least one conductive area disposed on the surface of the plate body away from the display panel, the at least one conductive area is electrically connected to the second heat dissipation structure.

In an exemplary implementation, a conductive adhesive layer is further included, the conductive adhesive layer is located between the at least one conductive area and the second heat dissipation structure.

In an exemplary implementation, the second heat dissipation structure includes a bottom wall, at least a portion of a surface of the bottom wall away from the display panel includes a second heat conduction area, and the second heat conduction area includes multiple second recesses.

In an exemplary implementation, the bottom wall includes a first sub-wall, the first heat generation element is disposed on a surface of the first sub-wall close to the display panel, and a surface of the first sub-wall away from the display panel includes the second heat conduction area.

In an exemplary implementation, the bottom wall further includes a second sub-wall and a third sub-wall, the first sub-wall is away from the display panel with respect to the third sub-wall, the second sub-wall is disposed to be inclined, the second sub-wall connects the first sub-wall with the third sub-wall so that the first sub-wall, the second sub-wall and the third sub-wall form a step-shaped structure.

In an exemplary implementation, a second heat dissipation space is formed between each of the second sub-wall and the third sub-wall and the first heat dissipation structure.

In the exemplary implementation, a cover plate is further included, the cover plate is disposed at a side of the display panel away from the first heat dissipation structure, the cover plate and the display panel are both curved in an arc shape, and the cover plate and the display panel have a same curved radian.

In the exemplary implementation, a material of the cover plate is glass.

In an exemplary implementation, a touch layer is further included, and the touch layer is located between the display panel and the cover plate.

In a second aspect, an embodiment of the present disclosure further provides an intelligent terminal, including the aforementioned display module.

Other aspects may be understood upon reading and understanding the drawings and detailed description.

BRIEF DESCRIPTION OF DRAWINGS

Accompanying drawings are used for providing an understanding for technical solutions of the present application and form a part of the specification, are used for explaining the technical solutions of the present application together with embodiments of the present application, and do not constitute a limitation on the technical solutions of the present application.

DETAILED DESCRIPTION

Figure 1:
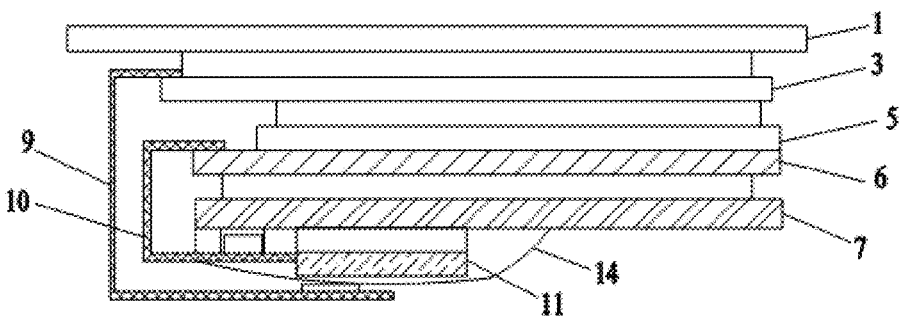
FIG. 1 is a schematic diagram of a structure of a display module in related art.

To make objectives, technical solutions, and advantages of the present disclosure clearer, the embodiments of the present disclosure will be described in detail with reference to the accompanying drawings. It is to be noted that implementations may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the drawings, a size of each constituent element, a thickness of a layer, or an area is exaggerated sometimes for clarity. Therefore, one implementation of the present disclosure is not necessarily limited to the sizes, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, a detachable connection, or an integral connection. It may be a mechanical connection or an electrical connection. It may be a direct mutual connection, or an indirect connection through middleware, or internal communication between two components. Those of ordinary skills in the art may understand specific meanings of these terms in the present disclosure according to specific situations.

In the specification, a transistor refers to an element which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulation layer" sometimes.

In the present disclosure, "about" refers to that a boundary is defined not so strictly and numerical values within process and measurement error ranges are allowed.

FIG. 1 is a schematic diagram of a structure of a display module in related art. As shown in FIG. 1, the display module in the related art includes: a display panel 6, a heat dissipation structure 7 disposed at a first side of the display panel 6, a first heat generation element 11 disposed on a surface of the heat dissipation structure 7 away from the display panel 6, an anti-reflection layer 5 disposed at a second side of the display panel 6, a touch layer 3 disposed at a side of the anti-reflection layer 5 away from the display panel 6, and a cover plate 1 disposed at a side of the touch layer 3 away from the display panel 6. The second side of the display panel 6 is a display side of the display panel 6, i.e. a side that emits light, and the first side of the display panel 6 is a side away from the second side of the display panel 6.

As shown in FIG. 1, the first heat generation element 11 in the display module in the related art is electrically connected to a bonding area of the display panel 6 by a first flexible connection plate 10. The first heat generation element 11 is electrically connected to the touch layer 3 through the second flexible connection plate 9. In order to meet the demand for a narrow bezel of the display module, the first heat generation element 11 is folded to the first side of the display panel 6, so that the first heat generation element 11 is connected to the surface of the heat dissipation structure 7 away from the display panel 6.

According to research by the inventor of the present disclosure, the high heat generated by the first heat generation element 11 in the display module in related art cannot be quickly and effectively dissipated, so that the heat is transferred to the display panel 6 through the heat dissipation structure 7, which aggravates the local heat accumulation on the display panel 6, and leads to an excessively high local temperature of the display panel 6, and then leads to local yellowing and moire of the display panel 6 because of high heat, thus affecting the display effect. Moreover, long-term use will shorten a service life of light emitting materials in the high-temperature area of the display panel 6 and affect a service life of the display panel.

Figure 2:
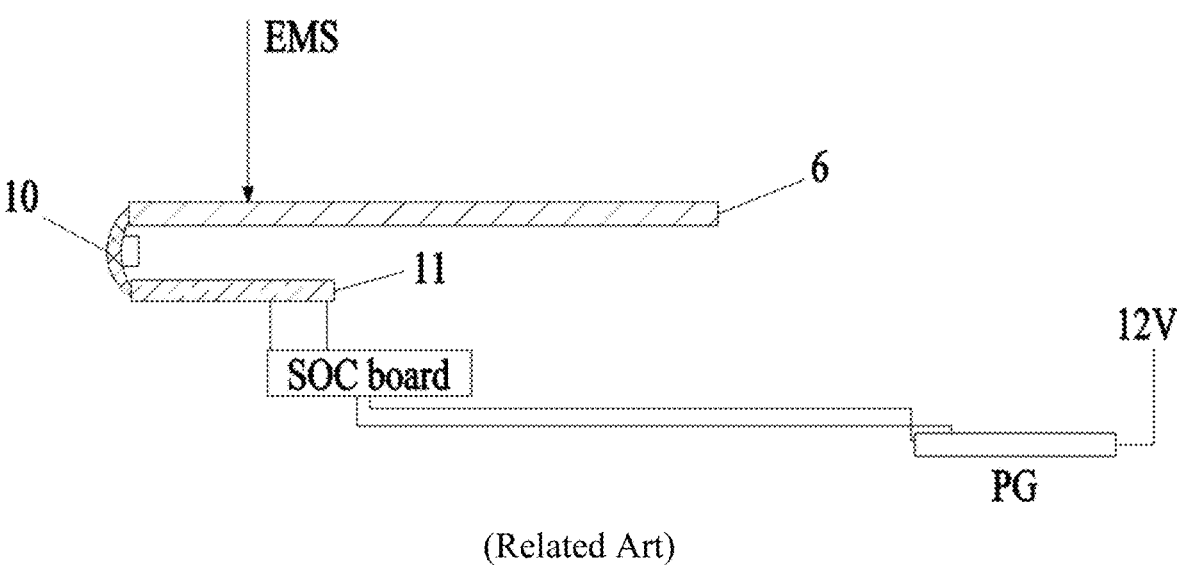
FIG. 2 is a schematic diagram of electromagnetic interference in a display module in related art.

FIG. 2 is a schematic diagram of electromagnetic interference in the display module in related art. As shown in FIGS. 1 and 2, an anti-electromagnetic interference film 14 is provided at a side, away from the display panel 6, of the first heat generation element 11 in the display module in related art, and the anti-electromagnetic interference film 14 is in electrical contact with an conductive area in the first heat generation element 11 and the heat dissipation structure 7 respectively. The conductive area of the first heat generation element 11 is electrically connected to the heat dissipation structure 7 through the anti-electromagnetic interference film 14 for shielding electromagnetic interference, for example, shielding the electromagnetic interference generated by a butterfly antenna.

According to the research by the inventor of the present disclosure, electromagnetic interference (EMI) can be transmitted to the first heat generation element 11 through the first flexible connection plate 10, which causes interference to components in the first heat generation element 11, resulting in white screen and black screen phenomena on the display panel 6 in certain frequency bands, and the display panel 6 cannot pass the electromagnetic compatibility (EMC) test in the whole frequency band.

The present disclosure further provides a display module, including:

a display panel;

a first heat dissipation structure, wherein the first heat dissipation structure is disposed at a first side of the display panel and configured to dissipate heat for display panel;

a second heat dissipation structure, wherein the second heat dissipation structure is disposed at a side of the first heat dissipation structure away from the display panel, and a heat dissipation space is provided between the second heat dissipation structure and the first heat dissipation structure; and a first heat generation element, wherein the first heat generation element includes at least one heat generation unit, and the at least one heat generation unit is located inside the heat dissipation space.

In the display module according to the present disclosure, disposing the first heat generation element on the second heat dissipation structure brings the following advantages: in a first aspect, the heat generated by the display panel can be dissipated through the first heat dissipation structure, and the heat generated by the first heat generation element can be dissipated through the second heat dissipation structure, thereby avoiding the display panel and the first heat generation element from dissipating heat through a same heat dissipation structure, thereby improving the heat dissipation performance of the display module. In a second aspect, the contact between the first heat generation element and the first heat dissipation structure is avoided through the heat dissipation space, and the heat of the first heat generation element is prevented from being transmitted to the display panel through the first heat dissipation structure, so as to reduce the local temperature of the display panel, ensure a display effect of the display module and prolong a service life of the display module; in a third aspect, the heat dissipation space is conducive to improving the fluidity of air between the first heat conduction structure and the first heat generation element, and accelerate a heat dissipation rate of the first heat generation element.

The display module of the present disclosure may be applied to a vehicle, such as a bicycle, a motorcycle, an intelligent terminal, a boat or an airplane. The display module may be formed on or coupled to at least one element of the vehicle. Hereinafter, a display module applied to an intelligent terminal will be described in detail as a typical example.

Figure 3A:
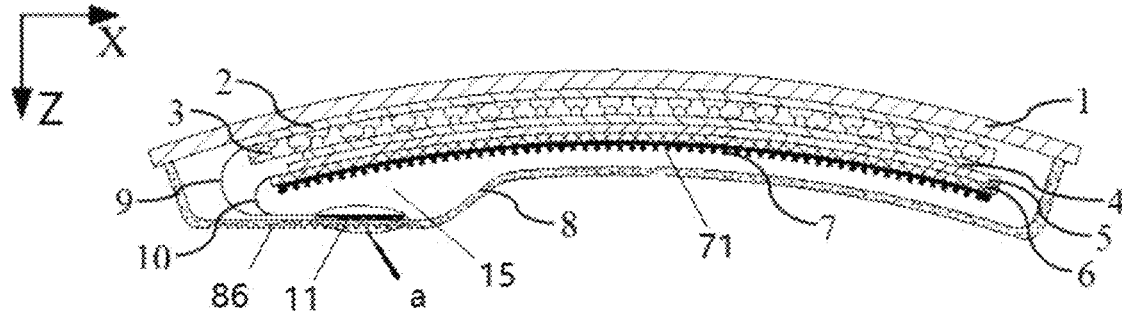
FIG. 3a is a first sectional view of a display module according to an embodiment of the present disclosure.
Figure 17:
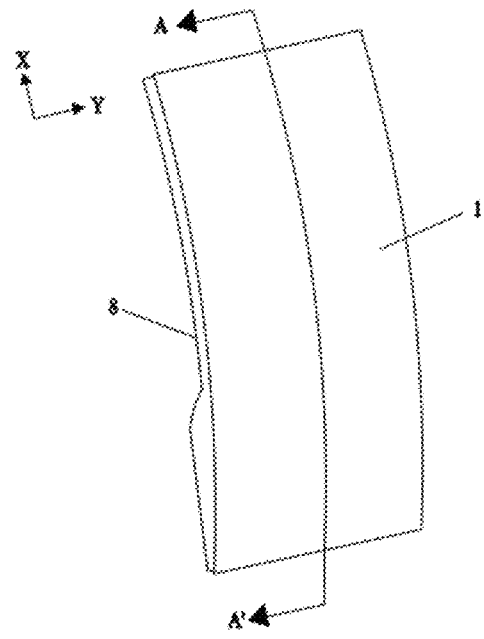
FIG. 17 is a schematic diagram of a structure of a display module according to an embodiment of the present disclosure.

FIG. 17 is a schematic diagram of a structure of a display module according to an embodiment of the present disclosure. FIG. 3*a* is a first sectional view of a display module according to an embodiment of the present disclosure, wherein FIG. 3*a* is a sectional view taken along A-A' direction in FIG. 17. In an exemplary embodiment, as shown in FIGS. 17 and 3*a*, the display module of the present disclosure includes: a display panel 6, a first heat dissipation structure 7 disposed at a first side of the display panel 6, a second heat dissipation structure 8 disposed at a side of the first heat dissipation structure 7 away from the display panel 6, a first heat generation element 11 disposed on a surface of the second heat dissipation structure 8 close to the first heat dissipation structure 7, an anti-reflection layer 5 disposed at a side of the display panel 6 away from the first heat dissipation structure 7, a first adhesive layer 4 disposed at a side of the anti-reflection layer 5 away from the display panel 6, a touch layer 3 disposed at a side of the first adhesive layer 4 away from the display panel 6, a second adhesive layer 2 disposed at a side of the touch layer 3 away from the display panel 6, and a cover plate 1 disposed at a side of the second adhesive layer 2 away from the display panel 6. The display module of the present disclosure further includes a first flexible connection plate 10 and a second flexible connection plate 9, wherein the first heat generation element 11 is electrically connected to a bonding area of the display panel 6 through the first flexible connection plate 10; the first heat generation element 11 is electrically connected to the touch layer 3 through the second flexible connection plate 9. The first flexible connection plate 10 may be a chip on film (COF for short), the second flexible connection board 9 may be a Flexible Printed Circuit board (FPC), the anti-reflection layer 5 may be a polarizer, the first heat generation element 11 may be a circuit board, and the circuit board may include a drive circuit unit and a touch circuit unit. The drive circuit unit is electrically connected to the bonding area of the display panel 6 through the first flexible connection board 10. The touch circuit unit is electrically connected to the touch layer 3 through the second flexible connection plate 9. The first side of the display panel 6 is a side of the display panel 6 away from the display side.

In an exemplary implementation, as shown in FIG. 3*a*, the first flexible connection plate 10 is connected between the display panel 6 and the first heat generation element 11. Specifically, one end of the first flexible connection plate 10 is electrically connected to the bonding area of the display panel 6, and the other end of the first flexible connection plate 10 is electrically connected to the first heat generation element 11. The first flexible connection plate 10 may be a foldable structure and capable of folding the first heat generation element 11 to the first side of the display panel 6.

In an exemplary implementation, as shown in FIG. 3*a*, in the display module of the embodiment of the present disclosure, the touch layer 3 is located between the display panel 6 and the cover plate 1. For example, the touch layer 3 is disposed at a side of the anti-reflection layer 5 away from the display panel 6. The touch layer 3 may be a touch sensor panel (TSP) configured to sense a touch position. A side of the touch layer 3 close to the bonding area of the display panel is connected to the second flexible connection plate 9, and the touch layer 3 is connected to the first heat generation element 11 through the second flexible connection plate 9.

In order to narrow the bezel of the display module, as shown in FIG. 3a, the first heat generation element 11 is disposed at the first side of the display panel 6. The first side of the display panel 6 is a side of the display panel 6 away from the display side, that is, a side of the display panel 6 indicated by an arrow along the direction Z is the first side of the display panel 6.

Figure 3B:
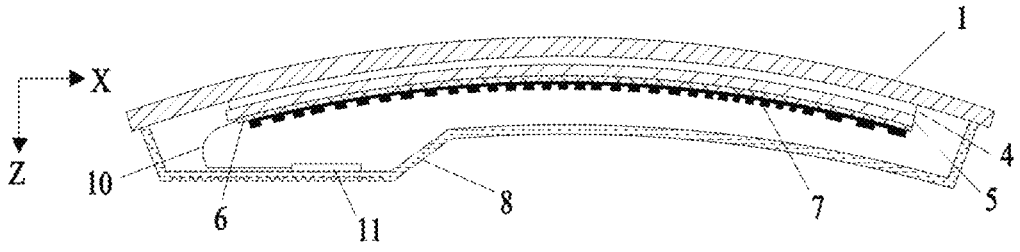
FIG. 3b is a second sectional view of a display module according to an embodiment of the present disclosure.

FIG. 3b is a second sectional view of a display module according to an embodiment of the present disclosure, wherein FIG. 3b is a sectional view taken along A-A' direction in FIG. 17. In an exemplary implementation, as shown in FIG. 3b, the display panel 6 in the display module according to an embodiment of the present disclosure may include a touch layer, that is, the touch layer is located in the display panel 6, and the touch layer is not located between the display panel 6 and the cover plate 1. The display module according to the embodiment of the present disclosure includes: a display panel 6, a first heat dissipation structure 7 disposed at a first side of the display panel 6, a second heat dissipation structure 8 disposed at a side of the first heat dissipation structure 7 away from the display panel 6, an anti-reflection layer 5 disposed at a side of the display panel 6 away from the first heat dissipation structure 7, a first adhesive layer 4 disposed at a side of the anti-reflection layer 5 away from the display panel 6, and a cover plate 1 disposed at a side of the first adhesive layer 4 away from the display panel 6. The display panel may include a base substrate, and a drive circuit layer, a light emitting structure layer, an encapsulation structure layer and a touch layer sequentially disposed on the base substrate.

Figure 3C:
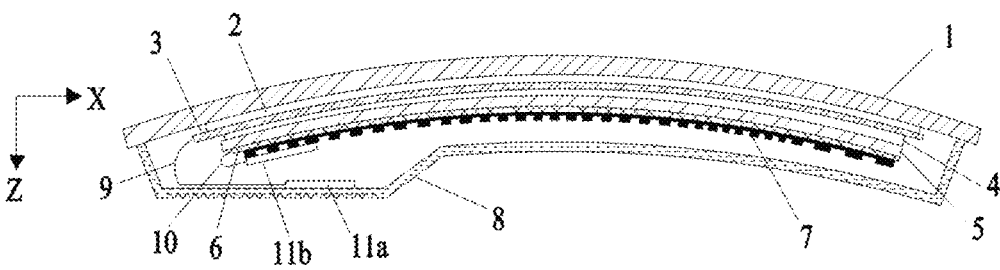
FIG. 3c is a third sectional view of a display module according to an embodiment of the present disclosure.

FIG. 3c is a third sectional view of a display module according to an embodiment of the present disclosure, wherein FIG. 3c is a sectional view taken along A-A' direction in FIG. 17. In an exemplary embodiment, as shown in FIG. 3c, the display module of the present disclosure includes: a display panel 6, a first heat dissipation structure 7 disposed at a first side of the display panel 6, a second heat dissipation structure 8 disposed at a side of the first heat dissipation structure 7 away from the display panel 6, an anti-reflection layer 5 disposed at a side of the display panel 6 away from the first heat dissipation structure 7, a first adhesive layer 4 disposed at a side of the anti-reflection layer 5 away from the display panel 6, a touch layer 3 disposed at a side of the first adhesive layer 4 away from the display panel 6, a second adhesive layer 2 disposed at a side of the touch layer 3 away from the display panel 6, and a cover plate 1 disposed at a side of the second adhesive layer 2 away from the display panel 6. The display module of the present disclosure further includes a first heat generation element including a first heat generation unit 11a and a second heat generation unit 11b. The first heat generation unit 11a is disposed on a surface of the second heat dissipation structure 8 close to the first heat dissipation structure 7, and the first heat generation unit 11a is electrically connected to the touch layer 3 through the second flexible connection plate 9. The second heat generation unit 11b is disposed on a surface of the first heat dissipation structure 7 away from the display panel 6, and the second heat generation unit 11b is electrically connected to the bonding area of the display panel 6 through the first flexible connection plate 10. The first heat generation unit 11a may be a touch circuit unit and the second heat generation unit 11b may be a drive circuit unit.

Figure 3D:
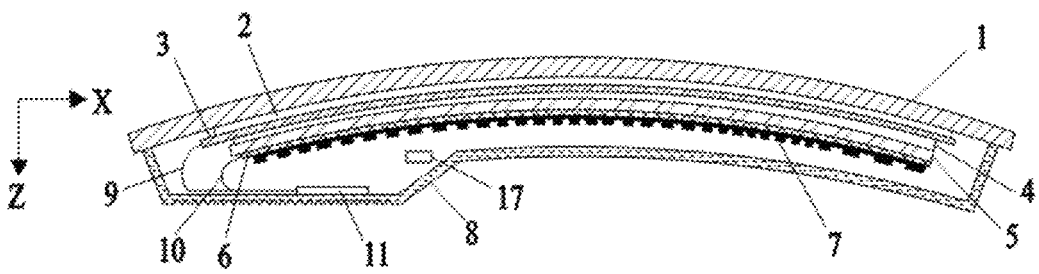
FIG. 3d is a fourth sectional view of a display module according to an embodiment of the present disclosure.

FIG. 3d is a fourth sectional view of a display module according to an embodiment of the present disclosure, wherein FIG. 3d is a sectional view taken along A-A' direction in FIG. 17. In an exemplary embodiment, as shown in FIG. 3d, the display module of the present disclosure includes: a display panel 6, a first heat dissipation structure 7 disposed at a first side of the display panel 6, a second heat dissipation structure 8 disposed at a side of the first heat dissipation structure 7 away from the display panel 6, a first heat generation element 11 disposed on a surface of the second heat dissipation structure 8 close to the first heat dissipation structure 7, an anti-reflection layer 5 disposed at a side of the display panel 6 away from the first heat dissipation structure 7, a first adhesive layer 4 disposed at a side of the anti-reflection layer 5 away from the display panel 6, a touch layer 3 disposed at a side of the first adhesive layer 4 away from the display panel 6, a second adhesive layer 2 disposed at a side of the touch layer 3 away from the display panel 6, and a cover plate 1 disposed at a side of the second adhesive layer 2 away from the display panel 6. The first heat generation element 11 is electrically connected to the bonding area of the display panel 6 through the first flexible connection plate 10. The first heat generation element 11 is electrically connected to the touch layer 3 through the second flexible connection plate 9. The display module of the present disclosure further includes a second heat generation element 17, and the second heat generation element 17 may be located inside the heat dissipation space, for example, the second heat generation element 17 may be located on a surface of the second heat dissipation structure 8 close to the first heat dissipation structure 7. Or, the second heat generation element 17 may be located between the first heat dissipation structure 7 and the second heat dissipation structure 8, and the second heat generation element 17 is not in contact with the first heat dissipation structure 7 or the second heat dissipation structure 8. The second heat generation element may include a battery, a camera module, a system circuit element and other components capable of giving out heat.

In some embodiments, the second heat generation element may be located outside the heat dissipation space, for example, the second heat generation element is located at a side of the second heat dissipation structure away from the first heat dissipation structure. However, this is not limited in the embodiment of the present disclosure.

Figure 3E:
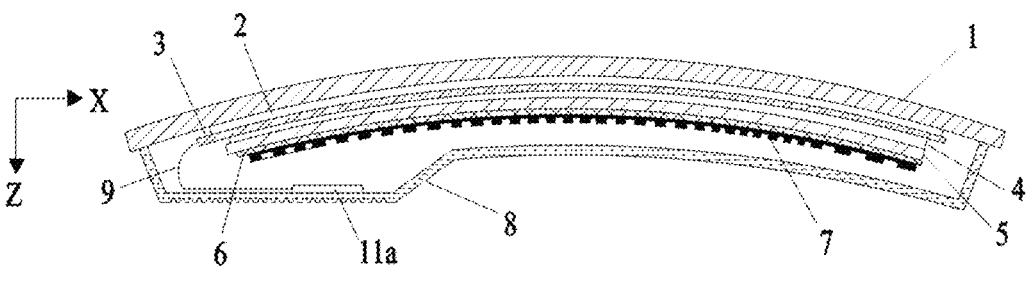
FIG. 3e is a fifth sectional view of a display module according to an embodiment of the present disclosure.

FIG. 3e is a fifth sectional view of a display module according to an embodiment of the present disclosure, wherein FIG. 3e is a sectional view taken along A-A' direction in FIG. 17. In an exemplary embodiment, as shown in FIG. 3e, the display module of the present disclosure includes: a display panel 6, a first heat dissipation structure 7 disposed at a first side of the display panel 6, a second heat dissipation structure 8 disposed at a side of the first heat dissipation structure 7 away from the display panel 6, an anti-reflection layer 5 disposed at a side of the display panel 6 away from the first heat dissipation structure 7, a first adhesive layer 4 disposed at a side of the anti-reflection layer 5 away from the display panel 6, a touch layer 3 disposed at a side of the first adhesive layer 4 away from the display panel 6, a second adhesive layer 2 disposed at a side of the touch layer 3 away from the display panel 6, and a cover plate 1 disposed at a side of the second adhesive layer 2 away from the display panel 6. The display module of the present disclosure further includes a first heat generation element, the first heat generation element includes a first heat generation unit 11a and a second heat generation unit (not shown in the figure). The first heat generation unit 11a is disposed on a surface of the second heat dissipation structure 8 close to the first heat dissipation structure 7, and the first heat generation unit 11*a* is electrically connected to the touch layer 3 through the second flexible connection plate 9. The display panel 6 includes a display area and a bonding area disposed on at least one side of the display area. The bonding area may include a fan-out area, a bending area, a drive chip area, and a bonding pin area that are sequentially disposed along a direction away from the display area. The fan-out area is connected to the display area and at least includes a data fan-out line. Multiple data fan-out lines are configured to be connected to data signal lines of the display area in a fan-out wiring manner. The bending area is connected to the fan-out area and may include a composite insulation layer provided with a groove, and the composite insulation layer is configured to enable the drive chip area and the bonding pin area to be bent to a first side of the display area 100. The drive chip area may be provided with the second heat generation unit, which may be configured to be connected to multiple data fan-out lines. The bonding pin area may include a bonding pad. The first heat generation unit 11*a* may be a touch circuit unit and the second heat generation unit 11*b* may be a drive circuit unit.

In some embodiments, the display panel in the display module of the present disclosure may include an anti-reflection layer, i.e. the anti-reflection layer is located in the display panel, and the anti-reflection layer is not located between the display panel and the cover plate. For example, the display panel may include a base substrate, and a drive circuit layer, a light emitting structure layer, an encapsulation structure layer and an anti-reflection layer sequentially disposed on the base substrate.

Figure 4:
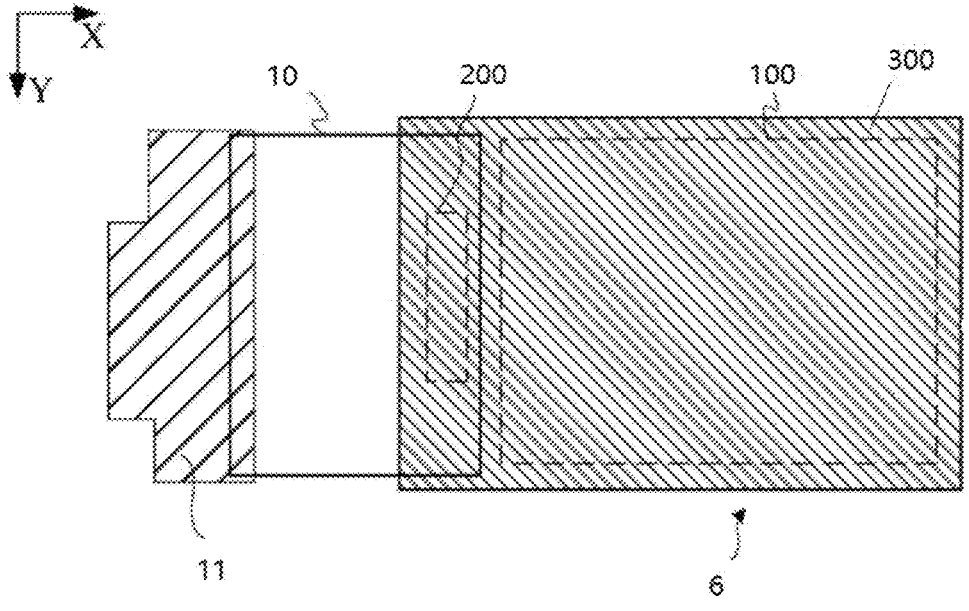
FIG. 4 is a schematic diagram of a connection between a display panel and a first heat generation element in a display module according to an embodiment of the present disclosure.

FIG. 4 is a schematic diagram of a connection between a display panel and a first heat generation element in a display module according to an embodiment of the present disclosure. As shown in FIG. 4, the display panel 6 may be any one of self-luminous display panels such as an organic light emitting diode (OLED) display panel, a quantum dot light emitting diode (QLED) display panel, and a miniLED (or microLED) display panel, and may also be a liquid crystal display (LCD) panel.

In an exemplary implementation, as shown in FIG. 4, the display substrate may include a display area 100, a bonding area 200 located on at least one side of the display area 100, and a bezel area 300 located at other sides of the display area 100.

In an exemplary implementation, the display panel 6 may be a flexible display panel, and the display panel 6 may be curved in an arc shape so that the display panel 6 has a curved surface, i.e. a surface of a second side of the display panel 6 is a curved surface having a certain radian. The second side of the display panel is a side away from a first side of the display panel. In some examples, the display panel may be a flat display panel.

In an exemplary implementation, as shown in FIG. 4, the display area 100 may have a rectangular shape. In some embodiments, the display area 100 may also have a circular shape, an elliptical shape, or a polygonal shape, such as a triangle, a pentagon, or the like.

In an exemplary implementation, the display area 100 of the display panel includes multiple sub-pixels that constitute a pixel array. The multiple sub-pixels are configured to display a dynamic picture or a static image, and the display area 100 may be referred to as an active area (AA). In an exemplary embodiment, the display area 100 of the display panel may include multiple pixel units arranged in a matrix. For example, at least one plurality of pixel unit may include a first sub-pixel emitting first-color light, a second sub-pixel emitting second-color light, and a third sub-pixel emitting third-color light and a fourth sub-pixel. Each sub-pixel may include a pixel circuit and a light emitting element. The pixel circuit is electrically connected to a scan signal line, a data signal line, and a light emitting control line respectively. The pixel circuit is configured to receive a data voltage transmitted by the data signal line under control of the scan signal line and the light emitting control line, and output a corresponding current to the light emitting element. The light emitting element in each sub-pixel is connected to a pixel circuit of a sub-pixel where the light emitting element is located, and is configured to emit light with a corresponding brightness in response to a current output by the pixel circuit of the sub-pixel where the light emitting element is located.

In an exemplary implementation, the first sub-pixel may be a red sub-pixel (R) emitting red light, the second sub-pixel may be a blue sub-pixel (B) emitting blue light, and the third sub-pixel and the fourth sub-pixel may be green sub-pixels (G) emitting green light. In some examples, a shape of a sub-pixel may be rectangle, diamond, pentagonal, hexagonal. The light emitting elements of the four sub-pixels may be arranged in a diamond-shaped manner to form an RGBG pixel arrangement. In other exemplary embodiments, the light emitting elements of the four sub-pixels may be arranged side by side horizontally, side by side vertically, or in a square-shaped manner, which is not limited in the present disclosure. In some other exemplary embodiments, the pixel unit may include three sub-pixels, and the light emitting elements of the three sub-pixels may be arranged side by side horizontally, side by side vertically, or in a triangle-shaped manner, which is not limited in the present disclosure.

Figure 5:
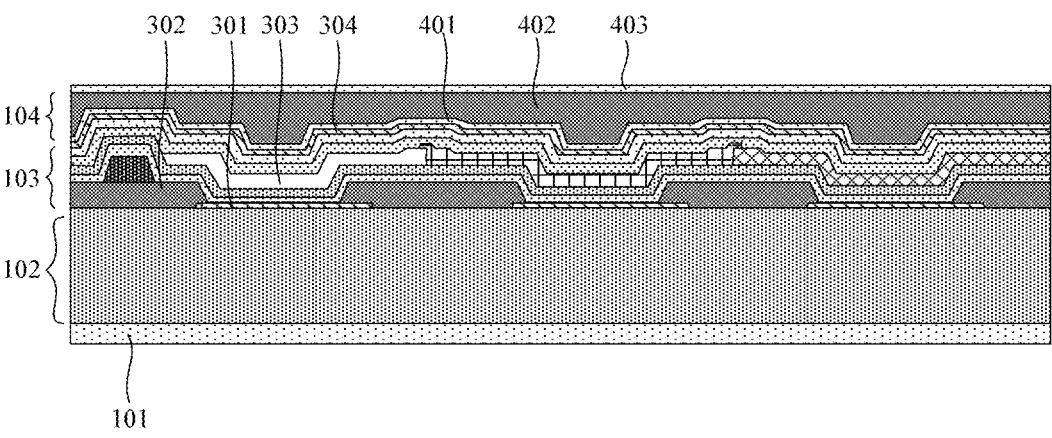
FIG. 5 is a sectional view of a display area of a display panel in a display module according to an embodiment of the present disclosure.

FIG. 5 is a sectional view of a display area of a display panel in a display module according to an embodiment of the present disclosure. FIG. 5 illustrates structures of three sub-pixels in the display area 100. As shown in FIG. 5, in a direction perpendicular to the display panel, the display substrate may include a base substrate 101, and a drive circuit layer 102, a light emitting structure layer 103 and an encapsulation layer 104 which are sequentially disposed on the base substrate 101. In some possible implementations, the display substrate may include other film layers, such as a touch structure layer, which is not limited in the present disclosure.

In an exemplary embodiment, the base substrate 101 may be a flexible substrate. The drive circuit layer 102 of each sub-pixel may include a pixel drive circuit composed of multiple transistors and capacitors. The light emitting structure layer 103 of each sub-pixel may at least include an anode 301, a pixel define layer 302, an organic light emitting layer 303 and a cathode 304. The anode 301 is connected to the pixel circuit, the organic light emitting layer 303 is connected to the anode 301, the cathode 304 is connected to the organic light emitting layer 303, and the organic light emitting layer 303 emits light of a corresponding color under driving of the anode 301 and the cathode 304. The encapsulation layer 104 may include a first encapsulation layer 401, a second encapsulation layer 402, and a third encapsulation layer 403 that are stacked. The first encapsulation layer 401 and the third encapsulation layer 403 may be made of an inorganic material, the second encapsulation layer 402 may be made of an organic material, and the second encapsulation layer is 402 disposed 403 between the first encapsulation layer 401 and the third encapsulation layer 403 to form a stacked structure of inorganic material/organic material/inorganic material and ensure that external moisture cannot enter the light emitting structure layer 103.

In an exemplary embodiment, the organic light emitting layer 303 may include an emitting layer (EML), and any one or more of following layers: a hole injection layer (HIL), a hole transport layer (HTL), an electron block layer (EBL), a hole block layer (HBL), an electron transport layer (ETL), and an electron injection layer (EIL). In some examples, one or more layers of hole injection layers, hole transport layers, electron block layers, hole block layers, electron transport layers, and electron injection layers of all sub-pixels may be communicated together to form a common layer. Emitting layers of adjacent sub-pixels may be overlapped slightly, or may be mutually isolated.

Following description is based on an example that the display panel 6 is an OLED display panel. Since some photons are converted into heat when the organic light-emitting layer emits light, accumulation of heat will reduce a service life of materials of the organic light-emitting layer and easily form display problems such as moire, so it is necessary to conduct the heat on the display panel 6 in time. In order to dissipate heat from the display panel 6, as shown in FIG. 3*a*, the first side of at least part of the display panel 6 is in contact with a surface of the first heat dissipation structure 7, the first heat dissipation structure 7 is configured to dissipate heat generated by the display panel 6 to reduce the temperature of the display panel 6 and avoid a display defect such as moire caused by excessive temperature of the display panel 6, thereby ensuring the display effect of the display panel 6.

In an exemplary implementation, the first heat dissipation structure 7 may include a heat conductive material having excellent heat conductivity which represents a material commonly referred to as a good heat conductor or known to have a heat transfer effect. In some embodiments, the first heat dissipation structure 7 may include a metal material having excellent thermal conductivity; for example, a metal such as copper (Cu), gold (Au), silver (Ag), aluminum (Al), magnesium (Mg), or nickel (Ni) may be included, and an alloy containing at least one of the above metals may also be included. In some other embodiments, the first heat dissipation structure 7 may include a carbon-based material having excellent thermal conductivity; for example, graphite, diamond, carbon fiber, etc. may be included. In addition, the first heat dissipation structure 7 may include a polymer material having excellent thermal conductivity, for example, it may be heat conductive silicone grease. However, materials of the first heat dissipation structure 7 are not limited to the above-mentioned materials and may include a combination of the above-mentioned materials or other materials not mentioned above.

In an exemplary implementation, the first heat dissipation structure 7 may be a layer which may be formed of one or a combination of the heat conductive materials listed above.

In an exemplary implementation, the first heat dissipation structure 7 may be an assembly having thermal conductivity similar to the heat conductive material. For example, the first heat dissipation structure 7 may include multiple layers that are stacked. At least one (e.g. one or each) of the layers may be formed from one or a combination of the above-listed heat conductive materials.

In an exemplary implementation, the first heat dissipation structure 7 includes a first heat conduction layer and a blackening layer located on a surface of the first heat conduction layer, which facilitates improving thermal radiation capability of the first heat conduction layer. The first heat conduction layer may be made of a metal material.

In an exemplary implementation, the blackening layer may be located on a surface of the first heat conduction layer away from the display panel 6. For example, the first heat conduction layer may be formed at first, and a blackening treatment may be performed on a surface of the first heat conduction layer to obtain the blackening layer. A method for forming the blackening layer includes but is not limited to anodic oxidation, electroplating, painting, etc. The blackening layer can increase the heat radiation of the surface of the first heat dissipation structure 7 and effectively prevent the high heat generated by the first heat generation element from being transmitted to the first heat dissipation structure 7.

In an exemplary implementation, a roughness of the surface of the first heat dissipation structure 7 close to the display panel 6 is less than or equal to 1 μm. The roughness here may be a contour arithmetic mean deviation (Ra). At this time, the surface is relatively smooth, and the first heat dissipation structure 7 can be flatly and tightly attached to the first side of the display panel 6, which can reduce the probability of damage to the display panel. In addition, an air gap between the first heat dissipation structure 7 and the display panel 6 is very small, so that the heat of the display panel 6 is mainly dissipated through the first heat dissipation structure 7.

In an exemplary implementation, a display module according to an embodiment of the present disclosure further includes a first heat conduction adhesive layer located between the first heat dissipation structure 7 and the display panel 6, and the first heat conduction adhesive layer connects the first heat dissipation structure 7 with the display panel 6. A surface at a side of the first heat conduction adhesive layer is in surface contact with a surface of the first heat dissipation structure 7, and a surface at the other side of the first heat conduction adhesive layer is in surface contact with the first side surface of the display panel 6. The first heat conduction adhesive layer may be made of a composite heat conductive adhesive with good thermal conductivity, for example, the thermal conductivity of the first heat conduction adhesive layer may be greater than or equal to 0.6 W/(m·K). A thickness of the first heat conduction adhesive layer may be in a range of 20 to 200 μm, for example, the thickness of the first heat conduction adhesive layer may be 20 μm, 60 μm, 100 μm, 150 μm, 200 μm or the like. The first heat conduction adhesive layer can conduct the heat of the display panel 6 to the first heat dissipation structure 7 and dissipate the heat through the first heat dissipation structure 7. The first heat conduction adhesive layer may include heat conductive silica gel or heat dissipation resin.

Figure 6:
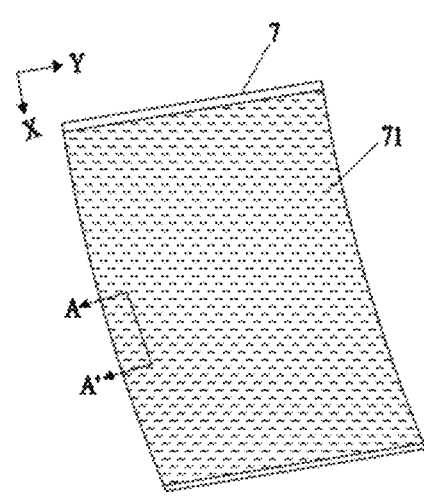
FIG. 6 is a schematic diagram of a structure of a first heat dissipation structure in a display module according to an embodiment of the present disclosure.
Figure 7:
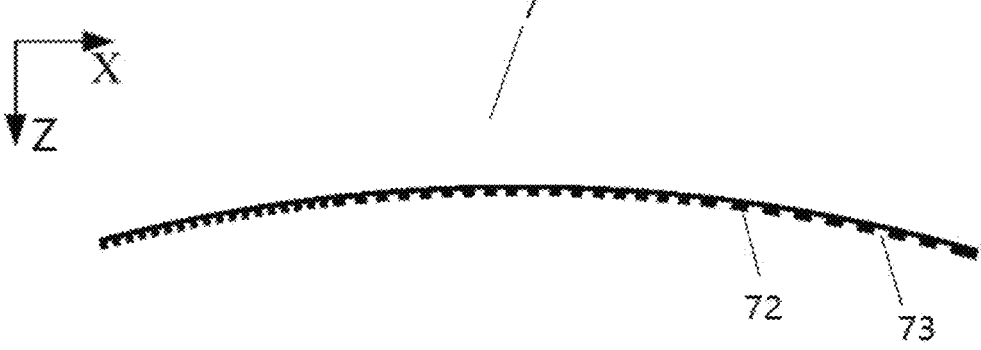
FIG. 7 is a sectional view of a first heat dissipation structure in a display module according to an embodiment of the present disclosure.

FIG. 6 is a schematic diagram of a structure of a first heat dissipation structure in a display module according to an embodiment of the present disclosure. FIG. 7 is a sectional view of a first heat dissipation structure in a display module according to an embodiment of the present disclosure. FIG. 7 is a sectional view taken along A-A direction in FIG. 6. In an exemplary implementation, as shown in FIGS. 6 and 7, the first heat dissipation structure 7 is curved in an arc shape so that the first heat dissipation structure 7 can be completely attached to the display panel 6 having a curved surface. A curved radian of the first heat dissipation structure 7 is the same as or similar to a curved radian of the display panel 6.

In an exemplary implementation, as shown in FIGS. 6 and 7, a surface of the first heat dissipation structure 7 away from the display panel 6 include a first heat conduction area 71. An orthographic projection of at least part of the display panel 6 on the first heat dissipation structure 7 has an overlapped area with the first heat conduction area 71. For example, an orthographic projection of the display area of the display panel 6 on the first heat dissipation structure 7 is located in the first heat conduction area 71, so that heat generated by the display panel 6 can be conducted and dissipated through the first heat conduction area 71, and the first heat conduction area 71 can help reduce the local temperature on the display panel.

In an exemplary implementation, as shown in FIGS. 6 and 7, the first heat conduction area 71 includes at least one first recess 73. The at least one first recess 73 facilitates improving fluidity of the air and accelerating dissipating the heat of the first heat dissipation structure 7.

In an exemplary implementation, each first recess 73 may have a groove structure, and the first recess 73 includes a bottom surface, an opening and a sidewall. The bottom surface is located at a side of the first recess 73 close to the display panel, and the opening is located on a side of the first recess 73 away from the display panel.

In some embodiments, the first recess may have a through hole structure, the first recess penetrates through the first heat dissipation structure along the direction Z, i.e. the first recess penetrates through the first heat conduction layer and the blackening layer along the direction Z to further accelerate the dissipation of heat.

In an exemplary implementation, as shown in FIG. 7, the first heat conduction area 71 further includes at least one first protrusion 72. The at least one first protrusion 72 is located between adjacent first recesses 73, to separate the adjacent first recesses 73. The at least one first protrusion 72 can increase a heat dissipation area of the first heat dissipation structure 7 and improve a heat dissipation effect of the first heat dissipation structure 7.

In an exemplary implementation, a material of the at least one first protrusion 72 may be the same as a material of the first heat conduction layer, and multiple first protrusions 72 form an integrated layer structure with the first heat conduction layer. For example, the integrated layer structure may be made of any of the metal materials described above. The first heat dissipation structure 7 includes the first heat conduction layer, the multiple first protrusions 72 integrally formed with the first heat conduction layer, and the blackening layer located on surfaces of the multiple first protrusions 72 and the first recesses 73.

In some embodiments, a material of the multiple first protrusions 72 may be different from the material of the first heat conduction layer, and the multiple first protrusions 72 may be joined with the first heat conduction layer by welding, bonding, or the like.

In an exemplary implementation, as shown in FIG. 7, the first heat conduction area 71 includes multiple first recesses 73, and the multiple first recesses 73 in the first heat conduction area have a nonuniform distribution density. For example, the distribution density of the multiple first recesses 73 in the first heat conduction area 71 gradually decreases along a direction X of the first heat conduction area 71. Lengths of the first recess 73 in the first heat conduction area 71 in the direction X gradually increase along the direction X of the first heat conduction area 71, and lengths of the multiple first protrusions 72 in the first heat conduction area 71 in the direction X gradually increase along the direction X of the first heat conduction area 71. In the display module according to the embodiment of the present disclosure, the nonuniform distribution density of the multiple first recesses 73 facilitates dissipating heat in a high-temperature area of the display panel 6 as soon as possible and is conducive to improving temperature uniformity of the display panel 6. The direction X is different from direction Z and, for example, the direction X is perpendicular to the direction Z.

In an exemplary implementation, since the display panel generates high heat in the bonding area, for accelerating the heat dissipation in the bonding area in the display panel, the distribution density of the multiple first recesses 73 in the first heat conduction area 71 gradually decreases from a direction close to the bonding area of the display panel 6 to a direction away from the bonding area of the display panel 6, so that more first recesses 73 are provided in a region in close to the bonding area in the first heat conduction area 71, so as to enhance the heat dissipation effect in this area, thereby increasing the heat dissipation rate in the bonding area in the display panel and improving the temperature uniformity of the display panel 6.

In some embodiments, the distribution of the multiple first recesses 73 in the first heat conduction area 71 may be uniform, which facilitates its design and manufacture.

In some embodiments, the first heat conduction area 71 may include multiple sub-heat conduction areas, and an overall distribution density of the multiple first recesses, shapes of the first recesses, and sizes of the first recesses in the multiple sub-heat conduction areas may be the same or different. For example, the multiple sub-heat conduction areas may be arranged along the direction X, and the overall distribution density of the multiple first recesses in the multiple sub-heat conduction areas gradually decreases along the direction X. An overall distribution density of multiple first recesses in a sub-heat conduction area refers to a ratio of the number of all the first recesses in that sub-heat conduction area to an area of that sub-heat conduction area.

Figure 8:
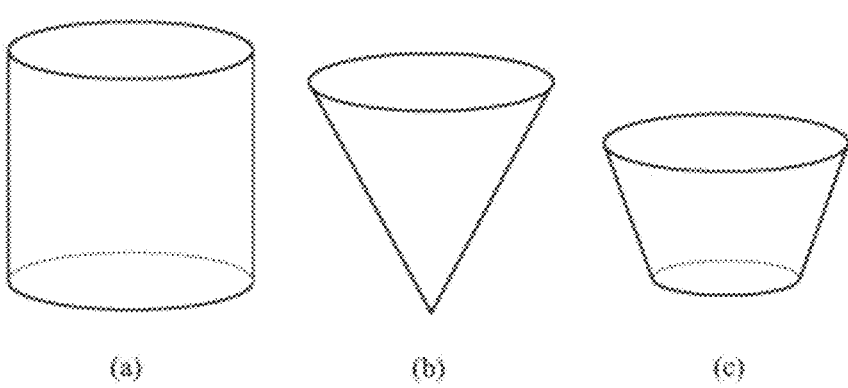
FIG. 8 is a perspective view of a first recess in a display module according to an embodiment of the present disclosure.

FIG. 8 is a perspective view of a first recess in a display module according to an embodiment of the present disclosure. In an exemplary implementation, as shown in (a) of FIG. 8, the first recess 73 may be a column. The column includes a bottom surface and an opening, the bottom surface and the opening are located at opposite sides of the column, the bottom surface is located at one side of the column close to the display panel, and the opening is located at one side of the column away from the display panel. The bottom surface and the opening may have a same shape and a same area. In the figure, the column being a cylinder is taken as an example, and the bottom surface and opening of the column are circular. In some embodiments, the column may be an elliptical column or a prism or the like. The prism may be divided into a triangular prism, a quadrangular prism, a pentagonal prism and the like according to different shapes of the bottom surface.

In some embodiments, as shown in (b) of FIG. 8, the first recess 73 may be a cone. The cone includes an opening and a side surface formed by connecting a boundary of the opening to a common vertex. The opening is located at a side of the cone away from the display panel. In the figure, a cone is taken as an example, and the opening of the cone is circular. In some embodiments, the cone may be a pyramid or the like. The pyramid may be divided into triangular pyramid, quadrangular pyramid, pentagonal pyramid and so on according to different shapes of the bottom surface.

In some embodiments, as shown in (c) of FIG. 8, the first recess 73 may be a boss. The cone may be truncated by a plane parallel to the bottom of the cone, the part between the bottom surface and the truncated surface is called the boss, and the truncated surface serves as the opening of the boss. In the figure, taking the cone being a circular cone as an example, the bottom surface and opening of the boss are circular, and an area of the bottom surface is larger than an area of the opening. In some embodiments, the boss may be an elliptical boss or a prismatic boss. The prismatic boss may be divided into triangular prismatic boss, quadrangular prismatic boss, pentagonal prismatic boss and so on according to the shape of the bottom surface. The boss may be a trapezoid, the trapezoid includes a bottom surface and an opening. The bottom surface is located at a side of the trapezoid close to the display panel, the opening is located at a side of the trapezoid away from the display panel, the bottom surface and the opening are parallel and rectangular, and four side surfaces are trapezoidal.

Figure 9:
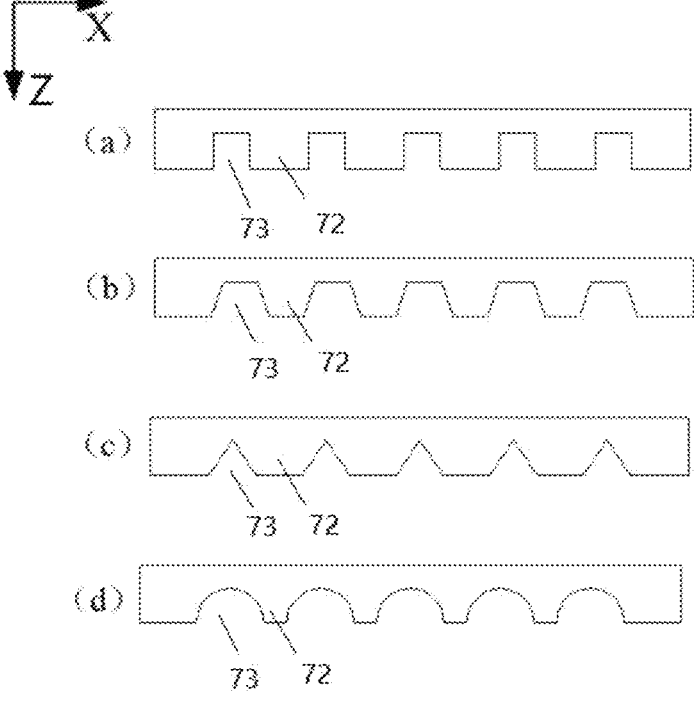
FIG. 9 is a partial sectional view of a first heat dissipation structure in a display module according to an embodiment of the present disclosure.

FIG. 9 is a partial sectional view of a first heat dissipation structure in a display module according to an embodiment of the present disclosure. In an exemplary implementation, as shown in (a) of FIG. 9, a cross section of a first protrusion 72 in the direction Z is rectangular. The first recess 73 has a groove structure, the first recess 73 may be cylindrical, and a cross section of the first recess 73 in the direction Z is rectangular. In some embodiments, the cross section of the first recess in the direction Z may be a polygon, such as a pentagon, a hexagon, or the like.

In an exemplary implementation, as shown in (b) of FIG. 9, the cross section of the first protrusion 72 in the direction Z is an inverted trapezoid. The first recess 73 has a groove structure, the first recess 73 may be a boss, and the cross section of the first recess 73 in the direction Z is a regular trapezoidal shape.

In an exemplary implementation, as shown in (c) of FIG. 9, the cross section of the first protrusion 72 in the direction Z is an inverted trapezoid. The first recess 73 has a groove structure, the first recess 73 may be a cone, and the cross section of the first recess 73 in the direction Z is triangular.

In the exemplary implementation, as shown in (d) of FIG. 9, the cross-section of the first protrusion 72 in the direction Z is an inverted trapezoid, and a side of the cross-section of the first protrusion 72 in the direction Z is an inwardly curved arc. The first recess 73 has a groove structure, the first recess 73 may be hemispherical, and the cross section of the first recess 73 in the direction Z is a circular arc.

Figure 10A:
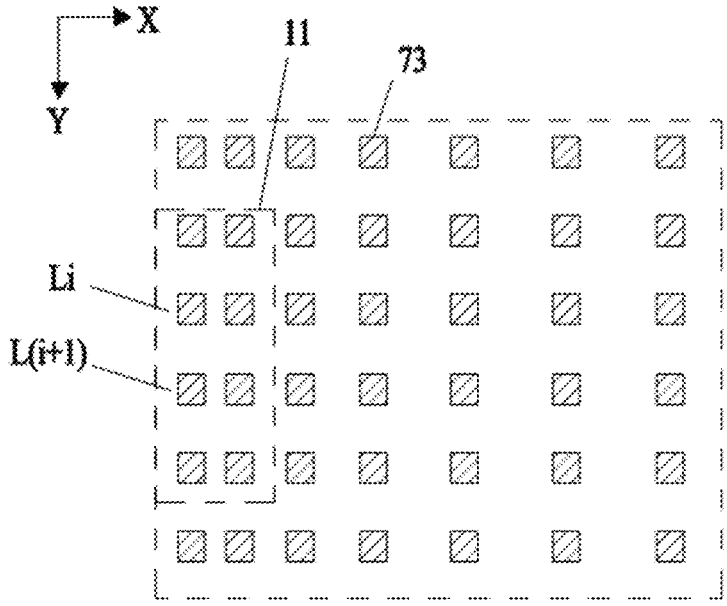
FIG. 10a is a first schematic diagram of a partial arrangement of first recesses in a display module according to an embodiment of the present disclosure.

FIG. 10*a* is a first schematic diagram of a partial arrangement of first recesses in a display module according to an embodiment of the present disclosure. In an exemplary implementation, as shown in 10*a*, orthographic projections of the first recess 73 on the first dissipation structure 7 are rectangular. The multiple first recesses 73 are arranged in multiple rows of recesses extending in a first direction (for example, direction X). Each of the rows of recesses includes at least two first recesses 73, and a distance between two adjacent first recesses 73 in one of the rows of recesses is different, so that a distribution density of the multiple first recesses 73 is nonuniform. For example, the distribution density of the multiple first recesses 73 gradually decreases in the first direction (for example, the direction X). In the display module according to the embodiment of the present disclosure, the nonuniform distribution density of the multiple first recesses 73 facilitates dissipating heat in the high-temperature area of the display panel 6 as soon as possible and is conducive to improving the temperature uniformity of the display panel 6.

In an exemplary implementation, as shown in FIG. 10*a*, a distribution density of the multiple first recesses 73 at a side close to the first heat generation element 11 is larger than that a distribution density of the multiple first recesses at a side of away from the first heat generation element, and a large distribution density of the multiple first recesses 73 can accelerate the heat dissipation, which is conducive to accelerating dissipating heat generated by the first heat generation element 11 and facilitates improvement of temperature uniformity of the display panel 6.

In an exemplary implementation, as shown in FIG. 10*a*, the multiple rows of recesses are arranged along a second direction (e.g. direction Y) and at least part of the first recesses 73 in the adjacent rows of recesses Li and L (i+1) are aligned with each other. For example, all the first recesses 73 in the row of recesses Li and all the first recesses 73 in the row of recesses L (i+1) are aligned in the direction Y in one-to-one correspondence. The adjacent rows of recesses Li and L (i+1) denote any two adjacent rows of recesses. At this time, it means that the multiple first recesses 73 are distributed in a matrix. The first direction is different from the second direction, for example, the first direction is perpendicular to the second direction.

Figure 10B:
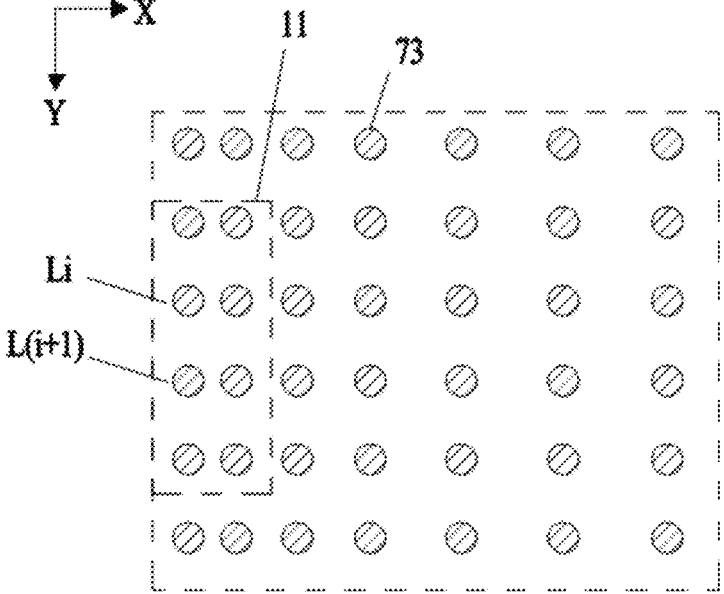
FIG. 10b is a second schematic diagram of a partial arrangement of first recesses in a display module according to an embodiment of the present disclosure.
Figure 10C:
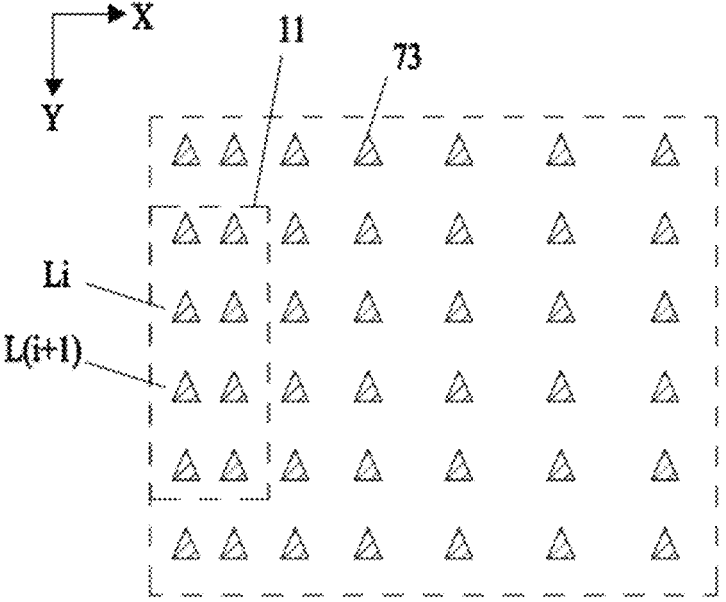
FIG. 10c is a third schematic diagram of a partial arrangement of first recesses in a display module according to an embodiment of the present disclosure.

FIG. 10*b* is a second schematic diagram of a partial arrangement of first recesses in a display module according to an embodiment of the present disclosure. FIG. 10*c* is a third schematic diagram of a partial arrangement of first recesses in a display module according to an embodiment of the present disclosure. In some embodiments, orthographic projections of the first recesses 73 on the first heat dissipation structure 7 may have various shapes. For example, the orthographic projections of the first recesses 73 on the first heat dissipation structure 7 may be circular, as shown in FIG. 10*b*. The orthographic projections of the first recesses 73 on the first heat dissipation structure 7 may be triangular, as shown in FIG. 10*c*. The orthographic projections of the first recesses 73 on the first heat dissipation structure 7 may be in a regular or irregular shape, such as a polygon, which is not repeated in the present disclosure.

Figure 10D:
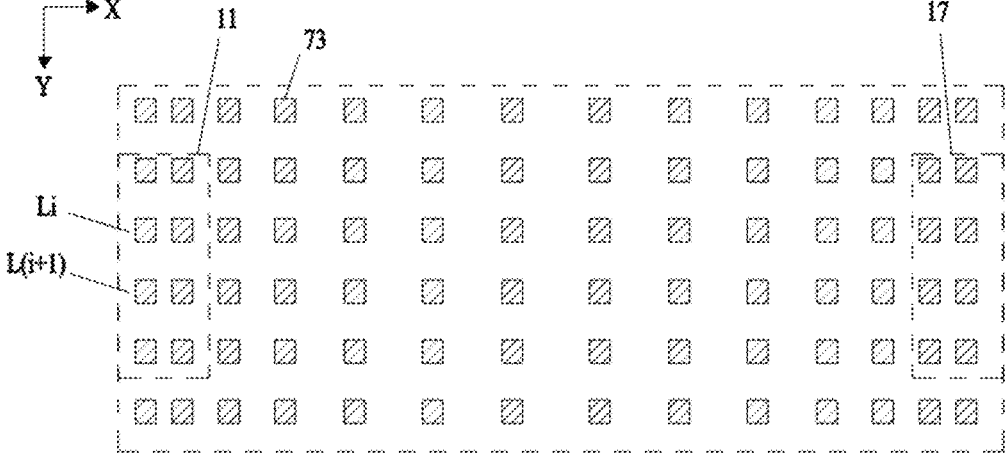
FIG. 10d is a fourth schematic diagram of a partial arrangement of first recesses in a display module according to an embodiment of the present disclosure.

FIG. 10*d* is a fourth schematic diagram of a partial arrangement of first recesses in a display module according to an embodiment of the present disclosure. In an exemplary implementation, as shown in FIG. 10*d*, the display module of the present disclosure includes a first heat generation element 11 and a second heat generation element 17. A distribution density of the multiple first recesses 73 at a side close to the first heat generation element 11 is greater than a distribution density of the multiple first recesses 73 at a side away from the first heat generation element 11. A distribution density of the multiple first recesses 73 at a side close to the second heat generation element 17 is greater than a distribution density of the multiple first recesses 73 at a side away from the second heat generation element 17. The large distribution density of the multiple first recesses 73 can accelerate the dissipation of heat, which is conducive to accelerating dissipating heat generated by the first heat generation element 11 and the second heat generation element 17, and improving temperature uniformity of the display panel 6.

Figures 11, 12:
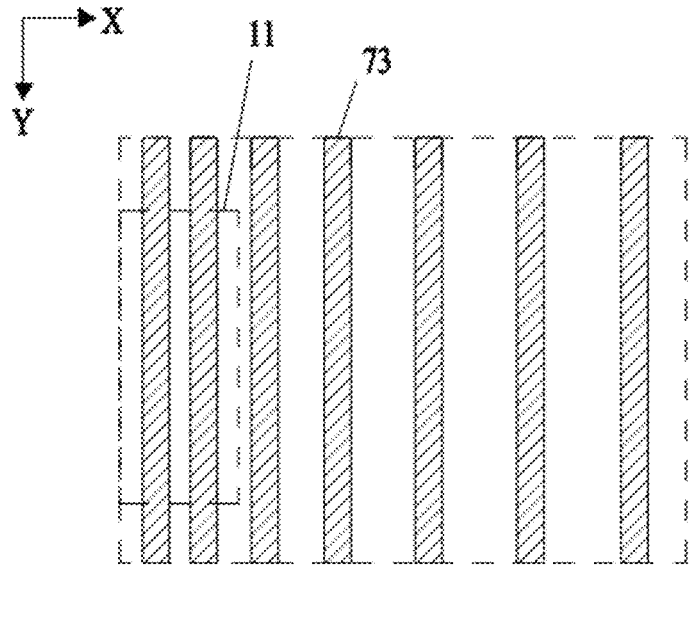
FIG. 11 is a fifth schematic diagram of a partial arrangement of first recesses in a display module according to an embodiment of the present disclosure.
FIG. 12 is a sixth schematic diagram of a partial arrangement of first recesses in a display module according to an embodiment of the present disclosure.

FIG. 11 is a fifth schematic diagram of a partial arrangement of first recesses in a display module according to an embodiment of the present disclosure. As shown in FIG. 11, the multiple first recesses 73 each extend in a third direction (e.g. direction Y). At this time, each of the first recesses 73 is in a strip shape. The multiple first recesses 73 are arranged in a fourth direction (for example, direction X). Different distances between the multiple first recesses 73 cause a nonuniform distribution density of the multiple first recesses 73. The distribution density of the multiple first recesses 73 in a direction close to an orthographic projection of the first heat generation element 11 on the first heat dissipation structure 7 is larger than a distribution density of the multiple first recesses 73 in a direction away from an orthographic projection of the first heat generation element 11 on the first heat dissipation structure 7. For example, the distribution density of the multiple first recesses 73 gradually decreases in the fourth direction (for example, the direction X). The third direction is different from the fourth direction, for example, the third direction is perpendicular to the fourth direction.

FIG. 12 is a sixth schematic diagram of a partial arrangement of first recesses in a display module according to an embodiment of the present disclosure. As shown in FIG. 12, the multiple first recesses 73 each extend in a fourth direction (e.g. direction X). At this time, each of the first recesses 73 is in a strip shape. The multiple first recesses 73 are arranged in a third direction (for example, direction Y).

In an exemplary implementation, the shapes and sizes of the multiple first recesses 73 in the first heat conduction area 71 may be same or different. For example, part of the first recesses 73 in the first heat conduction area 71 are columns, part of the first recesses 73 in the first heat conduction area 71 are cones, and part of the first recesses 73 in the first heat conduction area 71 are bosses. Or, the first recesses 73 in the first heat conduction area 71 have a same shape, and sizes of part of the first recesses 73 in the first heat conduction area 71 are larger than those of another part of the first recesses 73 in the first heat conduction area 71.

Figure 13A:
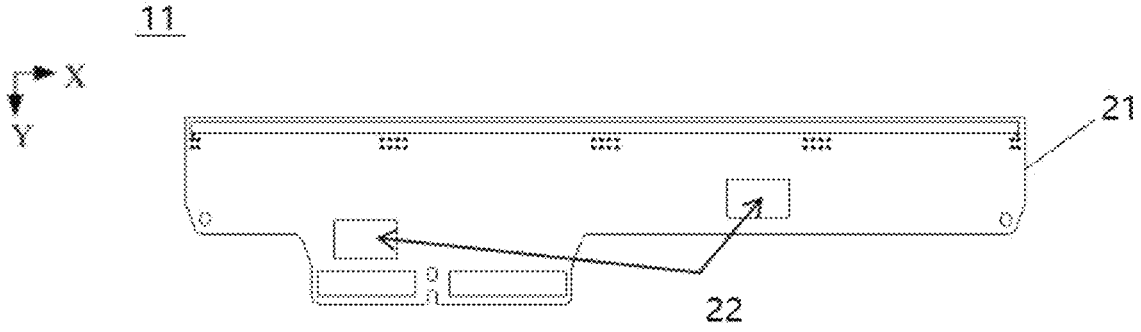
FIG. 13a is a schematic diagram of a structure at a side of a first heat generation element in a display module according to an embodiment of the present disclosure.
Figure 13B:
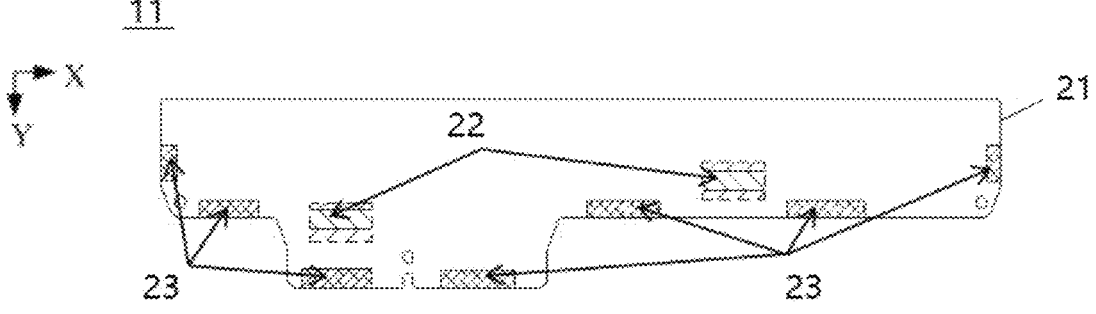
FIG. 13b is a schematic diagram of a structure at the other side of a first heat generation element in a display module according to an embodiment of the present disclosure.

FIG. 13a is a schematic diagram of a structure at a side of a first heat generation element in a display module according to an embodiment of the present disclosure. FIG. 13b is a schematic diagram of a structure at the other side of a first heat generation element in a display module according to an embodiment of the present disclosure. In an exemplary implementation, as shown in FIGS. 13a and 13b, the first heat generation element 11 includes a plate body 21, at least one component 22 disposed on a first surface of the plate body 21, and at least one conductive area 23 disposed on a second surface of the plate body 21. An orthographic projection of the at least one component 22 on the plate body 21 is not overlapped with an orthographic projection of the at least one conductive area 23 on the plate body 21. The first surface of the plate body 21 is a surface close to the display panel 6 and the second surface of the plate body 21 is a surface away from the display panel 6. The at least one component 22 may include components such as a drive circuit, for providing a drive signal to the display panel, and the element 22 generates a large amount of heat when operating.

Figure 14:
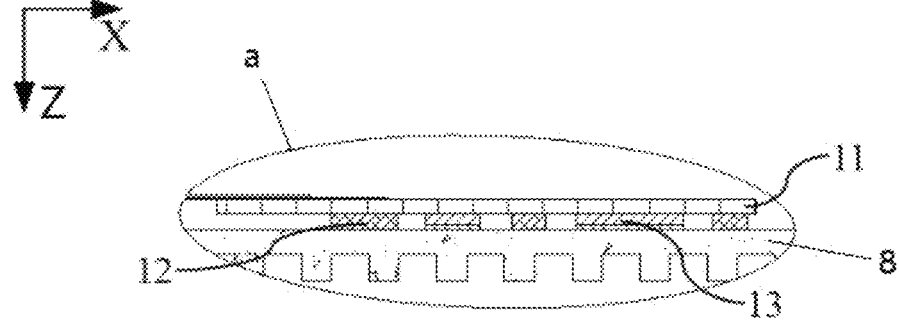
FIG. 14 is a schematic diagram of a connection of a first heat dissipation structure and a second heat dissipation structure in a display module according to an embodiment of the present disclosure.

FIG. 14 is a schematic diagram of a connection of a first heat generation element and a second heat dissipation structure in a display module according to an embodiment of the present disclosure. FIG. 14 is an enlarged view at a in FIG. 3a. In an exemplary implementation, as shown in FIGS. 3a and 14, at least part of the second surface of the plate body 21 is in surface contact with a bottom wall of the second heat dissipation structure 8, and the second heat dissipation structure 8 is configured to dissipate heat generated by the first heat generation element 11 to reduce the temperature of the first heat generation element 11.

In an exemplary implementation, as shown in FIG. 14, a display module according to an embodiment of the present disclosure further includes a second heat conduction adhesive layer 13. The second heat conduction adhesive layer 13 is positioned between the first heat generation element 11 and the bottom wall of the second heat dissipation structure 8, and an orthographic projection of the second heat conduction adhesive layer 13 on the first heat generation element 11 is not overlapped with the at least one conductive area 23 of the first heat generation element 11. A surface at a side of the second heat conduction adhesive layer 13 is in surface contact with a surface of the first heat generation element 11, and a surface at the other side of the second heat conduction adhesive layer 13 is in surface contact with the bottom wall of the second heat dissipation structure 8. The second heat conduction adhesive layer 13 may be made of a composite heat conductive adhesive with good thermal conductivity, for example, a thermal conductivity of the second heat conduction adhesive layer 13 may be greater than or equal to 0.6 W/(m·K). A thickness of the second heat conduction adhesive layer 13 may be in a range of 20 to 200 μm, for example, the thickness of the second heat conduction adhesive layer 13 may be 20 μm, 60 μm, 100 μm, 150 μm, 200 μm or the like. The second heat conduction adhesive layer 13 is configured to fix the first heat generation element 11 to the bottom wall of the second heat dissipation structure 8, and can conduct the heat of the first heat generation element 11 to the second heat dissipation structure 8 and dissipate it through the second heat dissipation structure 8. The second heat conduction adhesive layer may include heat conductive silica gel or heat dissipation resin.

In an exemplary implementation, as shown in FIG. 14, the display module according to the embodiment of the present disclosure further includes a conductive adhesive layer 12. The conductive adhesive layer 12 is located between the at least one conductive area 23 of the first heat generation element 11 and the bottom wall of the second heat dissipation structure 8. The conductive adhesive layer 12 may be selected as a conductive composite adhesive having good conductivity. The thickness of the conductive adhesive layer 12 may be in a range of 20 to 200 μm, for example, the thickness of the conductive adhesive layer 12 may be 20 μm, 60 μm, 100 μm, 150 μm, 200 μm or the like. The conductive adhesive layer 12 is configured to electrically connect the first heat generation element 11 with the second heat dissipation structure 8, so that the first heat generation element 11 and the second heat dissipation structure 8 are grounded, the electromagnetism of the first heat generation element 11 is conducted to the second heat dissipation structure 8 and transmitted out through the second heat dissipation structure 8, thus solving the electromagnetic interference (EMI) problem of the display module.

In the exemplary implementation, as shown in FIG. 14, the second heat conduction adhesive layer 13 and the conductive adhesive layer 12 are both positioned between the first heat generation element 11 and the bottom wall of the second heat dissipation structure 8, and the thicknesses of the second heat conduction adhesive layer 13 and the conductive adhesive layer 12 may be approximately the same, thereby ensuring the flatness after the first heat generation element 11 is connected to the bottom wall of the second heat dissipation structure 8.

In an exemplary implementation, as shown in FIG. 3a, a heat dissipation space 15 is provided between the second heat dissipation structure 8 and the first heat dissipation structure 7, and the heat dissipation space 15 separates the second heat dissipation structure 8 from the first heat dissipation structure 7, so that the first heat generation element 11 is not in contact with the first heat dissipation structure 7, and the heat of the first heat generation element 11 is prevented from being transmitted to the first heat dissipation structure 7, thereby avoiding excessive temperature of the display panel 6. Furthermore, the heat dissipation space 15 facilitates improving the fluidity of the air between the first heat conductive structure 7 and the first heat generation element 11, thus accelerating dissipating the heat of the first heat generation element 11.

In an exemplary implementation, the structure of the second heat dissipation structure 8 may be the same as the structure of the first heat dissipation structure 7, for example, the second heat dissipation structure 8 may include a blackening layer on a surface of a second heat conduction layer. The second heat conduction layer may be made of a metal material.

Figure 15A:
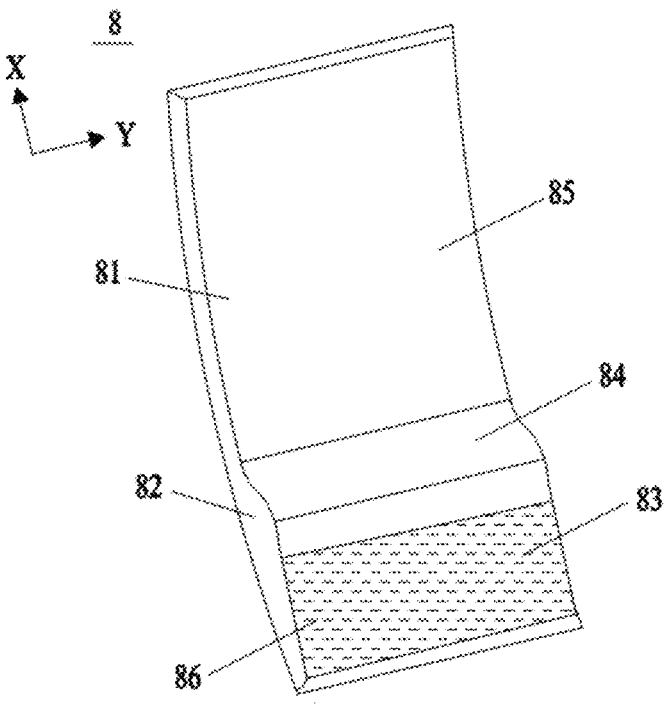
FIG. 15a is a first schematic diagram of a structure of a second heat dissipation structure in a display module according to an embodiment of the present disclosure.
Figure 15B:
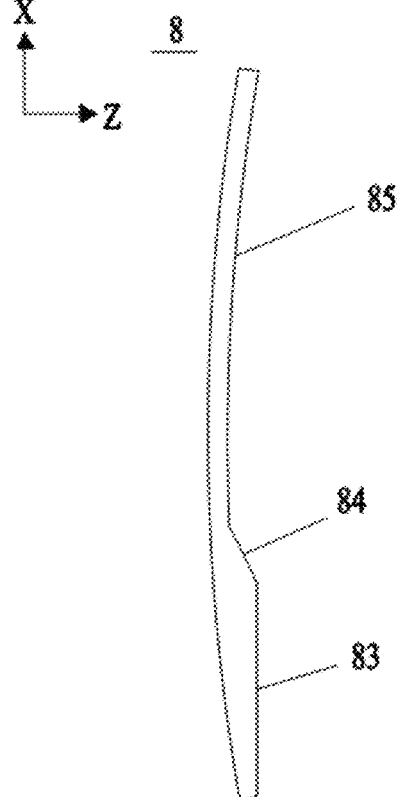
FIG. 15b is a second schematic diagram of a structure of a second heat dissipation structure in a display module according to an embodiment of the present disclosure.

FIG. 15*a* is a first schematic diagram of a structure of a second heat dissipation structure in a display module according to an embodiment of the present disclosure. FIG. 15*b* is a second schematic diagram of a structure of a second heat dissipation structure in a display module according to an embodiment of the present disclosure. FIG. 15*b* is a side view of FIG. 15*a*. In an exemplary implementation, as shown in FIGS. 3*a*, 15*a* and 15*b*, a surface of the second heat dissipation structure 8 away from the display panel 6 include a second heat conduction area 86. At least part of an orthographic projection of the first heat generation element 11 on the second heat dissipation structure 8 has an overlapped area with the second heat conduction area 86. For example, the orthographic projection of the first heat generation element 11 on the second heat dissipation structure 8 is located in the second heat conduction area 86, so that the heat generated by the first heat generation element 11 can be conducted and dissipated through the second heat conduction area 86.

In an exemplary implementation, as shown in FIGS. 3*a* 15*a* and 15*b*, the second heat conduction area 86 includes at least one second recess 87. The at least one second recess 87 facilitates improving the fluidity of the air and accelerating dissipating the heat of the first heat generation element 11. The at least one second recess 87 may have a same structure and arrangement as the first recesses 73. In some embodiments, the at least one second recess may have a different structure and arrangement from the first recess, which is not repeated in the present disclosure.

In an exemplary implementation, the arrangement of the at least one second recess 87 in the second heat conduction area 86 is the same as the arrangement of the first recesses 73 in the first heat conduction area. The shape of the at least one second recess 87 in the second heat conduction area 86 is the same as that of the first recesses 73 in the first heat conduction area, and the distribution density of the at least one second recess 87 may be the same as or different from the distribution density of the first recesses 73. For example, a ratio of the distribution density of the at least one second recess 87 to the distribution density of the first recesses 73 is 1/10 to 1. For example, the ratio of the distribution density of the at least one second recess 87 to the distribution density of the first recesses 73 is 1/5 to 1, so that the second heat dissipation structure 8 can accelerate dissipating the heat of the first heat generation element 11.

In an exemplary implementation, as shown in FIGS. 3*a*, 15*a* and 15*b*, the second heat dissipation structure 8 includes a bottom wall 81 and a side wall 82 disposed around the bottom wall 81. One end of the side wall 82 is connected to a periphery of the bottom wall 81, and the other end of the side wall 82 is connected to the cover plate 1. The bottom wall 81 includes a first sub-wall 83, a second sub-wall 84, and a third sub-wall 85 connected in sequence in the direction X. A first end of the first sub-wall 83 is connected to the side wall 82, a second end of the first sub-wall 83 is connected to a first end of the second sub-wall 84, a second end of the second sub-wall 84 is connected to a first end of the third sub-wall 85, and a second end of the third sub-side wall is connected to the side wall 82. The first sub-wall 83 and the third sub-wall 85 are both curved in an arc shape, and curved radians of the first sub-wall 83 and the third sub-wall 85 are the same as or similar to the curved radian of the display panel 6. The first sub-wall 83 is more distant from the display panel 6 relative to the third sub-wall 85. The second sub-wall 84 is disposed to be inclined and connect the first sub-wall 83 with the third sub-wall 85, so that the first sub-wall 83, the second sub-wall 84 and the third sub-wall 85 form a step-shaped structure.

In an exemplary implementation, as shown in FIGS. 3*a*, 15*a* and 15*b*, an orthographic projection of at least part of the bonding area of the display panel 6 on the bottom wall 81 of the second heat dissipation structure 8 is overlapped with the first sub-wall 83. The first heat generation element 11 is disposed on a surface of the first sub-wall 83 close to the display panel 6, a surface of the first sub-wall 83 away from the display panel 6 includes a second heat conduction area 86. An orthographic projection of at least part of the first heat generation element 11 on the first sub-wall 83 is overlapped with the second heat conduction area 86, so that heat generated by the first heat generation element 11 can be conducted and dissipated through the second heat conduction area 86, and the second heat conduction area 86 can help reduce the temperature of the first heat generation element 11.

In an exemplary implementation, as shown in FIGS. 3*a*, 15*a* and 15*b*, the first sub-wall 83, the second sub-wall 84 and the third sub-wall 85 may all be made of a same material and form an integrated layer structure. The second heat conduction area 86 is not overlapped with the second sub-wall 84 or the third sub-wall 85, i.e. the surfaces of the second sub-wall 84 and the third sub-wall 85 away from the display panel 6 do not include the second heat conduction area 86.

In some embodiments, the second heat conduction area 86 may extend from the surface of the first sub-wall 83 away from the display panel 6 to the surface(s) of the second sub-wall 84 and/or the third sub-wall 85 away from the display panel 6, i.e. the surface(s) of the second sub-wall 84 and/or the third sub-wall 85 away from the display panel 6 includes the second heat conduction area 86, thereby accelerating dissipating heat from the bottom wall 81 of the second heat dissipation structure 8.

In an exemplary implementation, as shown in FIGS. 3*a*, 15*a* and 15*b*, the heat dissipation space 15 is formed between each of the first sub-wall 83, the second sub-wall 84 and the third sub-wall 85 and the first heat dissipation structure 7, the heat dissipation space 15 separates the second heat dissipation structure 8 from the first heat dissipation structure 7 so that the first sub-wall 83, the second sub-wall 84 and the third sub-wall 85 are not in contact with the first heat dissipation structure 7, preventing the heat of the second heat dissipation structure 8 from being transferred to the first heat dissipation structure 7, thereby avoiding excessive temperature of the display panel 6. In addition, the heat dissipation space 15 facilitates improving the fluidity of air between the first heat conductive structure 7 and the bottom wall of the second heat dissipation structure 8, and accelerates dissipating the heat of the second heat dissipation structure 8.

In an exemplary implementation, as shown in FIG. 3*a*, the anti-reflection layer 5 is located at a side of the display panel 6 away from the first heat dissipation structure 7. Exemplarily, the anti-reflection layer 5 may be a circular polarizer capable of reducing influence of ambient light on the display screen.

In an exemplary implementation, a heat dissipation layer may be provided between the first heat generation element 11 and the second heat dissipation structure 8, and the heat dissipation layer accelerates the dissipation of heat generated by the first heat generation element 11. The heat dissipation layer may include a heat conductive material having excellent heat conductivity, and the heat conductive material represents a material commonly referred to as a good heat conductor or known to have a heat transfer effect. The material of the heat dissipation layer may be the same as that of the first heat dissipation structure 7.

Figure 16:
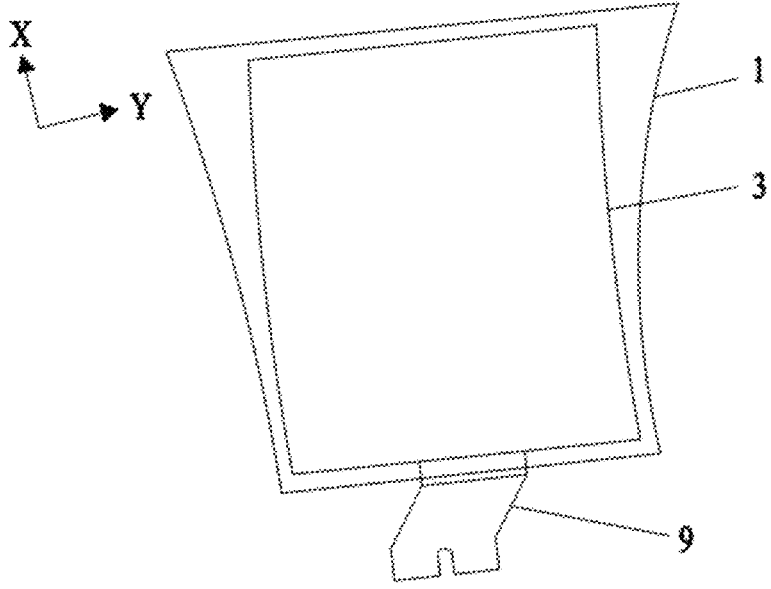
FIG. 16 is a schematic diagram of a connection of a cover plate and a touch layer in a display module according to an embodiment of the present disclosure.

FIG. 16 is a schematic diagram of a connection of a cover plate and touch layer in a display module according to an embodiment of the present disclosure. In an exemplary implementation, as shown in FIGS. 3*a* and 16, the cover plate 1 in the display module according to the embodiment of the present disclosure is curved in an arc shape, so that the cover plate 1 can be fully attached to the display panel 6 having a curved surface. The cover plate 1 may be made of a light-transmissive hard material, for example, the cover plate 1 may be made of glass. After the cover plate 1 is attached to the display panel 6 having the curved surface, the display module has a 3D display effect.

In an exemplary implementation, as shown in FIG. 3*a*, the first adhesive layer 4 is located between the touch layer 3 and the anti-reflection layer 5 for connecting the touch layer 3 with the anti-reflection layer 5. The second adhesive layer 2 is located between the touch layer 3 and the cover plate 1 for connecting the touch layer 3 with the cover plate 1. Materials of the first adhesive layer 4 and the second adhesive layer 2 may both be Optically Clear Adhesive (OCA).

In the exemplary implementation, as shown in FIG. 17, in the display module of the embodiment of the present disclosure, the cover plate 1, the touch layer 3, the anti-reflection layer 5, the display panel 6, the first heat dissipation structure 7, and the second heat dissipation structure 8 are stacked in order to form the display module. The side wall of the second heat dissipation structure 8 is connected to the cover plate 1, the second heat dissipation structure 8 and the cover plate 1 form an accommodation space, and the touch layer 3, the anti-reflection layer 5, the display panel 6, the first heat dissipation structure 7 and other components are disposed in the accommodation space. The display module has a curved surface for displaying, i.e. the display surface of the display module is a curved surface, so that the display module has a 3D display effect.

An embodiment of the present disclosure further provides an intelligence terminal, including any one of the display modules described above. The intelligence terminal may be a display device including a mobile phone, a tablet computer, a smart wearable product (such as a smart watch, a bracelet, or the like), a personal digital assistant (PDA), or the like. The intelligent terminal may also be an intelligent terminal mounted on a vehicle or an aircraft, for example, an automobile, an airplane and a spacecraft.

Although the implementations disclosed in the present disclosure are described as above, the described contents are only implementations which are used for facilitating the understanding of the present disclosure, but are not intended to limit the present disclosure. Any skilled person in the art to which the present disclosure pertains may make any modifications and variations in forms and details of implementation without departing from the spirit and scope of the present disclosure. However, the patent protection scope of the present disclosure should be subject to the scope defined by the appended claims.

The invention claimed is:
1. A display module, comprising:
   a display panel;

a first heat dissipation structure, wherein the first heat dissipation structure is disposed at a first side of the display panel and configured to dissipate heat for display panel;

a second heat dissipation structure, wherein the second heat dissipation structure is disposed at a side of the first heat dissipation structure away from the display panel, and a heat dissipation space is provided between the second heat dissipation structure and the first heat dissipation structure; and a first heat generation element, wherein the first heat generation element comprises at least one heat generation unit, and the at least one heat generation unit is located inside the heat dissipation space.

2. The display module according to claim 1, wherein at least part of the display panel is in surface contact with the first heat dissipation structure, and the first heat dissipation structure is configured to dissipate heat generated by the display panel.

3. The display module according to claim 1, wherein a surface of the first heat dissipation structure away from the display panel comprises a first heat conduction area, the first heat conduction area comprises a plurality of first recesses.

4. The display module according to claim 3, wherein an orthographic projection of at least part of the display panel on the first heat dissipation structure has an overlapped area with the first heat conduction area.

5. The display module of claim 3, wherein a first recess has a through hole structure or a groove structure.

6. The display module according to claim 3, wherein the plurality of first recesses in the first heat conduction area have a nonuniform distribution density.

7. The display module according to claim 6, wherein the display panel comprises a display area and a bonding area located on at least one side of the display area, and the nonuniform distribution density of the plurality of first recesses in the first heat conduction area gradually decreases from a direction close to the bonding area of the display panel to a direction away from the bonding area of the display panel; or the nonuniform distribution density of the plurality of first recesses on a side close to the first heat generation element is greater than the nonuniform distribution density of the plurality of first recesses on a side away from the first heat generation element; or the display module further comprises a second heat generation element, the second heat generation element is located inside the heat dissipation space, and the nonuniform distribution density of the plurality of first recesses on a side close to the second heat generation element is greater than the nonuniform distribution density of the plurality of first recesses on a side away from the second heat generation element.

8. The display module according to claim 3, wherein the first heat conduction area further comprises at least one first protrusion located between adjacent first recesses.

9. The display module according to claim 3, wherein a first recess may be at least one of a column, a cone, a boss, and a strip.

10. The display module according to claim 3, wherein the plurality of first recesses are arranged in a plurality of rows of recesses extending in a first direction, each row of recesses comprises at least two first recesses, the plurality of rows of recesses are arranged in a second direction, and at least a part of the first recesses in adjacent rows of recesses are aligned, and the first direction is different from the second direction.

11. The display module according to claim 1, wherein a material of the first heat dissipation structure comprises one or a combination of a metal, an alloy, a carbon base, and a polymer having thermal conductivity; or the display module further comprises a first heat conduction adhesive layer, the first heat conduction adhesive layer is located between the first heat dissipation structure and the display panel; or the first heat dissipation structure comprises a first heat conduction layer and a blackening layer disposed on a surface of the first heat conduction layer; or the first heat generation element comprises a plate body and at least one component disposed on a surface of the plate body close to the display panel, at least a portion of a surface of the plate body away from the display panel is in surface contact with the second heat dissipation structure, and the second heat dissipation structure is configured to dissipate heat generated by the first heat generation element.

12. The display module according to claim 11, further comprising a second heat conduction adhesive layer, the second heat conduction adhesive layer is located between the first heat generation element and the second heat dissipation structure; or the first heat generation element further comprises at least one conductive area disposed on the surface of the plate body away from the display panel, the at least one conductive area is electrically connected to the second heat dissipation structure.

13. The display module according to claim 12, further comprising a conductive adhesive layer, the conductive adhesive layer is located between the at least one conductive area and the second heat dissipation structure.

14. The display module according to claim 1, wherein the second heat dissipation structure comprises a bottom wall, and at least a portion of a surface of the bottom wall away from the display panel comprises a second heat conduction area, and the second heat conduction area comprises a plurality of second recesses.

15. The display module according to claim 14, wherein the bottom wall comprises a first sub-wall, the first heat generation element is disposed on a surface of the first sub-wall close to the display panel, and a surface of the first sub-wall away from the display panel comprises the second heat conduction area.

16. The display module according to claim 15, wherein the bottom wall further comprises a second sub-wall and a third sub-wall, the first sub-wall is away from the display panel with respect to the third sub-wall, the second sub-wall is disposed to be inclined, the second sub-wall connects the first sub-wall with the third sub-wall so that the first sub-wall, the second sub-wall and the third sub-wall form a step-shaped structure.

17. The display module according to claim 16, wherein the second sub-wall and the third sub-wall respectively form a second heat dissipation space with the first heat dissipation structure.

18. The display module according to claim 1, further comprising a cover plate, the cover plate is disposed at a side of the display panel away from the first heat dissipation structure, the cover plate and the display panel are both curved in an arc shape, and the cover plate and the display panel have a same curved radian.

19. The display module according to claim 18, wherein a material of the cover plate is glass; or the display module comprises a touch layer, the touch layer is located between the display panel and the cover plate.

20. An intelligent terminal, comprising the display module according to claim 1.

* * * * *